United States Patent
Terauchi

(10) Patent No.: US 6,710,341 B2
(45) Date of Patent: Mar. 23, 2004

(54) ELECTRON MICROSCOPE EQUIPPED WITH X-RAY SPECTROMETER

(75) Inventor: Masami Terauchi, Miyagi (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/084,768

(22) Filed: Feb. 26, 2002

(65) Prior Publication Data

US 2002/0158200 A1 Oct. 31, 2002

(30) Foreign Application Priority Data

Feb. 27, 2001 (JP) ........................................ 2001-052761
Oct. 24, 2001 (JP) ........................................ 2001-326066

(51) Int. Cl.$^7$ ...................... H01J 37/256; H01J 37/244; H01J 37/24; G01N 23/26; G01N 23/04
(52) U.S. Cl. ...................... 250/310; 250/306; 250/307; 250/311; 250/370.09; 378/43; 378/63; 378/49; 378/51; 378/62; 378/64; 378/120; 378/90; 378/92
(58) Field of Search ................................ 250/310, 311, 250/306, 307, 370.09; 378/43, 63, 49, 51, 62, 120, 64, 92, 90

(56) References Cited

U.S. PATENT DOCUMENTS

| | | | | |
|---|---|---|---|---|
| 3,914,605 A | * | 10/1975 | Hara ............................ 378/83 |
| 4,012,843 A | * | 3/1977 | Harada et al. ................ 33/19.2 |
| 4,192,994 A | * | 3/1980 | Kastner ....................... 356/334 |
| 4,312,569 A | * | 1/1982 | Harada et al. ............... 359/570 |
| 4,398,823 A | * | 8/1983 | Brown et al. ................ 250/372 |
| 4,492,466 A | * | 1/1985 | Aspnes ....................... 356/334 |
| 4,776,696 A | * | 10/1988 | Hettrick et al. ............. 250/372 |
| 4,891,829 A | * | 1/1990 | Deckman et al. ............. 378/19 |
| 4,910,399 A | * | 3/1990 | Taira et al. .................. 250/310 |
| 5,065,020 A | * | 11/1991 | Kanda ......................... 250/310 |
| 5,266,802 A | * | 11/1993 | Kasai .......................... 250/310 |
| 5,450,463 A | * | 9/1995 | Iketaki ......................... 378/43 |
| 5,656,812 A | * | 8/1997 | Takahashi |
| 5,659,174 A | * | 8/1997 | Kaneoka et al. ............ 250/307 |
| 5,715,052 A | * | 2/1998 | Fujino et al. .......... 250/559.41 |
| 5,877,035 A | * | 3/1999 | Fujino et al. ................. 438/16 |
| 5,880,467 A | * | 3/1999 | Martinis et al. ............. 250/310 |
| 5,903,004 A | * | 5/1999 | Koshihara et al. .......... 250/310 |
| 5,990,480 A | * | 11/1999 | Yamada et al. ............. 250/310 |
| 6,124,142 A | * | 9/2000 | Fujino et al. ................. 438/15 |
| 6,255,127 B1 | * | 7/2001 | Fujino et al. ................ 250/234 |
| 6,452,177 B1 | * | 9/2002 | Feldman et al. ............ 250/307 |
| 2002/0119455 A1 | * | 8/2002 | Chan ............................. 435/6 |

* cited by examiner

Primary Examiner—John R. Lee
Assistant Examiner—Bernard Souw
(74) Attorney, Agent, or Firm—Webb Ziesenheim Logsdon Orkin & Hanson, P.C.

(57) ABSTRACT

An electron microscope is offered which is fitted with an X-ray spectrometer having a compact optical system and high resolution. The spectrometer has a spectrometer chamber whose inside is evacuated by a vacuum pumping system. A diffraction grating having unequally spaced grooves is placed in the chamber. An X-ray detector is mounted to an end of the chamber. The X-ray spectrometer is mounted to the sidewall of the electron microscope via a gate valve. A specimen is irradiated with an electron beam and emits characteristic X-rays, which are made to impinge on the face of the grating at a large angle with respect to the normal line to the face. Diffracted X-rays from the grating reach the X-ray detector and are detected.

8 Claims, 4 Drawing Sheets

ELECTRON MICROSCOPE EQUIPPED WITH X-RAY SPECTROMETER

BACKGROUND OF THE INVENTION

1. Field of the Invention

The present invention relates to an electron microscope equipped with an X-ray spectrometer.

2. Description of the Related Art

Heretofore, an electron probe microanalyzer (EPMA) comprising a scanning electron microscope (SEM) to which a wavelength-dispersive spectrometer (WDS) is attached has been known. In particular, when a specimen is irradiated with an electron beam within the electron microscope, characteristic X-rays are emitted. The emitted X-rays are detected by the WDS, and an X-ray analysis (elemental analysis) is made. This WDS needs a mechanism for aligning three points (X-ray generation point (specimen), the center point of a dispersive crystal, and the center point of the slit in the detector) to given points on a Rowland circle. Furthermore, the radius of the Rowland circle is as long as several meters. Consequently, a large-sized optical system arises. Furthermore, since the incidence angle to the dispersive crystal (i.e., the angle with respect to the normal line to a crystal face) is small, the detector is placed close to the microscope column of the electron microscope. This makes it difficult to determine the arrangement of the whole equipment.

Attempts have been made to combine an energy-dispersive spectrometer (EDS) with a transmission electron microscope (TEM) or SEM. Characteristic X-rays from a specimen are detected by the EDS. However, the EDS has unsatisfactory energy resolution compared with a WDS for electron probe microanalysis (EPMA).

We have developed a combination of a transmission electron microscope (TEM) and an energy filter to provide an instrument capable of making an energy analysis at a high resolution. Where this instrument is used, the dielectric function and the distribution of state densities of the conduction band of an area of a specimen having a diameter of 30 nm can be known. For detailed research into electron states, it is necessary to know the state density distribution in the valence band as well as the state density distribution in the conduction band.

As mentioned previously, a transmission electron microscope (TEM) equipped with an EDS can make an elemental analysis using characteristic X-rays produced from an area irradiated with an electron beam. If the spectrum of the characteristic X-rays can be measured at an energy resolution of better than about 1 eV, the distribution of state densities of the valence band can be known. Unfortunately, the energy resolution of the current EDS using a semiconductor detector is approximately 100 to 200 eV, which is insufficient for research into electron states. Furthermore, WDS has higher resolution (about 10 eV) than EDS but the energy resolution is not high enough to know the state densities of valence bands.

SUMMARY OF THE INVENTION

It is an object of the present invention to provide an electron microscope which is equipped with an X-ray spectrometer, has a compact optical system, and provides high energy resolution.

An electron microscope according to the present invention has an X-ray spectrometer mounted to the sidewall of the microscope via a gate valve. The X-ray spectrometer has a spectrometer chamber whose interior is evacuated by a vacuum pumping system. At least one diffraction grating having unequally spaced grooves is disposed in the chamber. An X-ray detector is mounted to one end of the chamber. Characteristic X-rays produced from a specimen irradiated with an electron beam are made to impinge on the face of the diffraction grating at a large angle with respect to the normal line to the face. That is, the X-rays are obliquely incident on the face. The diffracted X-rays are detected by the X-ray detector.

A back-illuminated CCD detector can be used as the aforementioned X-ray detector. Preferably, the exit angle of the X-rays diffracted by the diffraction grating having the unequally spaced grooves is 75 to 87° with respect to the normal line to the face of the diffraction grating.

It is also possible to mount an X-ray condenser mirror for collecting the characteristic X-rays emitted from the specimen toward the diffraction grating having the unequally spaced grooves.

In another embodiment of the invention, a plurality of diffraction gratings each of which has unequally spaced grooves and which are different in measured energy range are mounted. A diffraction grating-exchanging mechanism can be provided which can selectively place the diffraction gratings in a characteristic X-ray incident position, one at a time.

In a further embodiment of the invention, a grating tilt-adjusting mechanism is provided which adjusts the tilt of the diffraction grating of unequally spaced grooves set in the characteristic X-ray incident position. Preferably, the CCD detector described above is connected with the spectrometer chamber via a bellows and thus the chamber is movable relative to the diffraction grating.

Preferably, the bellows described above consists of plural bellows elements cascaded together, the bellows elements stretching and contracting in different directions. The CCD detector is movable in two dimensions relative to the diffraction gratings by combining stretching and contraction of the bellows elements.

Other objects and features of the invention will appear in the course of the description thereof, which follows.

DESCRIPTION OF THE PREFERRED EMBODIMENTS

Figure 1:
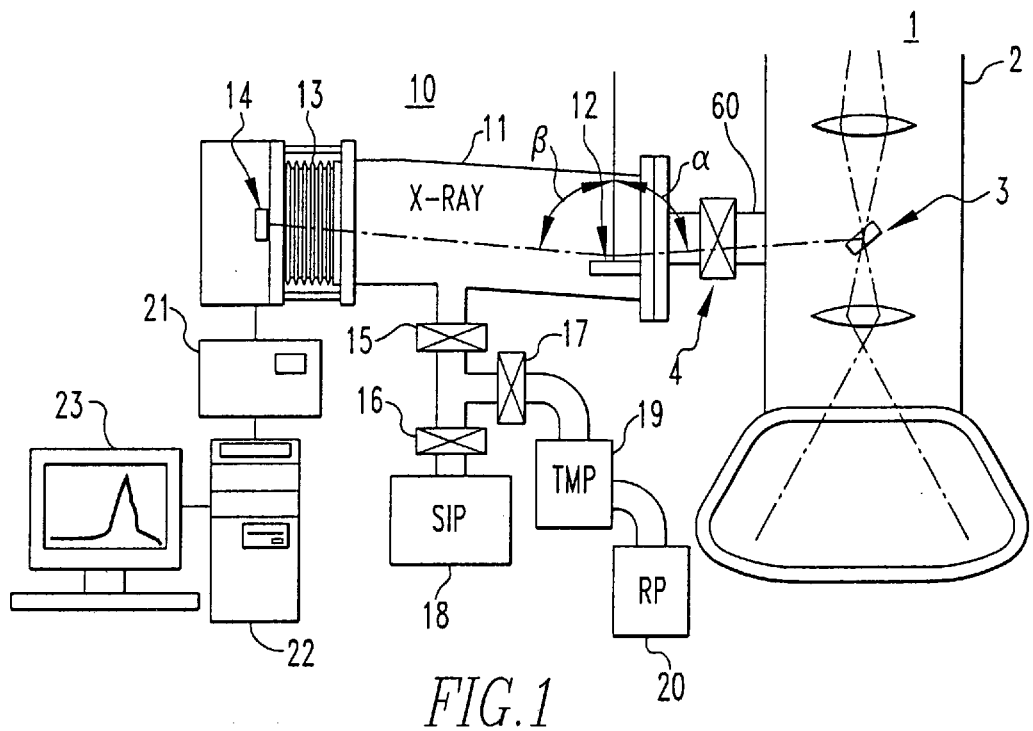
FIG. 1 is a diagram showing one example of a transmission electron microscope equipped with an X-ray spectrometer.

A transmission electron microscope fitted with an X-ray spectrometer according to the present invention is shown in FIG. 1. The transmission electron microscope (TEM), indicated by reference numeral 1, has a microscope column 2 whose inside is maintained at a vacuum. An electron beam is shone at a specimen 3 from above via electron lenses, the specimen 3 being placed within the microscope column 2. Electrons transmitted through the specimen are projected onto a fluorescent screen via electron lenses. As a result, a TEM image is created on the fluorescent screen.

The inside of the microscope column 2 has a specimen chamber in which the specimen 3 is placed. The sidewall of this specimen chamber is provided with a hole to permit characteristic X-rays emitted from the specimen to be taken out of the microscope column 2. An X-ray spectrometer 10 is mounted in this hole via a connector tube 60 having a gate valve 4. The gate valve 4 is placed between the spectrometer 10 and the microscope column of the TEM 1 to isolate their vacuums from each other. The spectrometer 10 is composed of a diffraction grating 12 and a back-illuminated CCD detector 14. The grating 12 is placed within a spectrometer chamber 11. The CCD detector 14 is mounted to an end of the spectrometer chamber 11 via a bellows 13.

The diffraction grating 12 is provided with unequally spaced grooves to correct aberrations. It is known that where light is made to impinge on such a diffraction grating at a large incidence angle, an imaging plane vertical to the diffracted radiation can be accomplished. Accordingly, in the present embodiment, the incidence angle α to the diffraction grating is so selected that characteristic X-rays emitted from the specimen 3 illuminated with an electron beam within the TEM 1 impinge on the face of the diffraction grating at the large incidence angle α (i.e., almost parallel to the face of the diffraction grating). Because of this oblique incidence, the focus of the diffracted X-rays is created on a plane (the face of the CCD) almost vertical to the radiation rather than on the Rowland circle. The dispersion provided by this diffraction grating is smaller than that provided by an ordinary grooved diffraction grating. Therefore, a wide energy range can be detected using the fixed CCD detector 14.

The spectrometer chamber 11 is evacuated to a vacuum by a turbomolecular pump (TMP) 19 combined with a rotary pump 20 and by a sputter ion pump (SIP) 18 via valves 15, 16, and 17. Since the CCD detector 14 is mounted to the spectrometer chamber 11 via the bellows 13, it is possible to finely adjust the distance from the diffraction grating. A signal taken from the CCD detector 14 under the control of the CCD controller 21 is sent to a data processor 22, where the data is processed. Its spectrum is displayed on a monitor 23.

The diffraction grating of the present embodiment has 1200 grooves per millimeter and is so disposed that the spacing varies gradually along the direction of travel of the X-rays from one side to the other. The diffraction grating has a concave surface having a radius of 6549 mm. The width (taken perpendicularly to the direction of X-rays) is 30 mm and the length (in the direction of X-rays) is 50 mm. A gold layer is deposited on the surface by surface processing technology.

The incidence angle α with respect to the normal line to the face of the diffraction grating is set to 87°. The exit angle β is set to 77–83°. The length of one arm (i.e., the distance from the specimen to the illuminated point on the diffraction grating) is set to 237 mm. The length of another arm (i.e., the distance from the diffraction grating to the CCD detector) is set to 235 mm. The back-illuminated CCD detector has 1100×330 pixels. The size is 26.4 mm×7.9 mm. The size of each pixel is 24 μm×24 μm, which provides a resolution corresponding to the exit angle of 77–83°.

The spot size of the diffracted X-rays focused onto the CCD detector is a superimposition of the size of the electron beam on the specimen and the spread due to the aberration of the diffraction grating. Experiment shows that the size of the electron beam focused onto the specimen is approximately 500 nm. It has been already reported that the spread of the spot due to aberration of a diffraction grating is estimated to be 40 μm at 248 eV and 20 μm at 124 eV. Therefore, the spread for boron K-emission energy of about 185 eV is estimated to be approximately 30 μm. Accordingly, the spot size of diffracted X-rays focused onto the CCD detector is mainly determined by the aberration. The energy dispersion in a diffraction grating is estimated to be about 0.3 eV per pixel size from $$\lambda = \sigma(\sin\alpha + \sin\beta) \tag{1}$$

where λ is the wavelength, σ is the spacing between grooves, α is the incidence angle, and β is the diffraction angle. Therefore, the energy resolution of a boron K-emission spectrum is estimated to be about 0.6 eV (0.3 eV×2 pixels).

Figure 2:
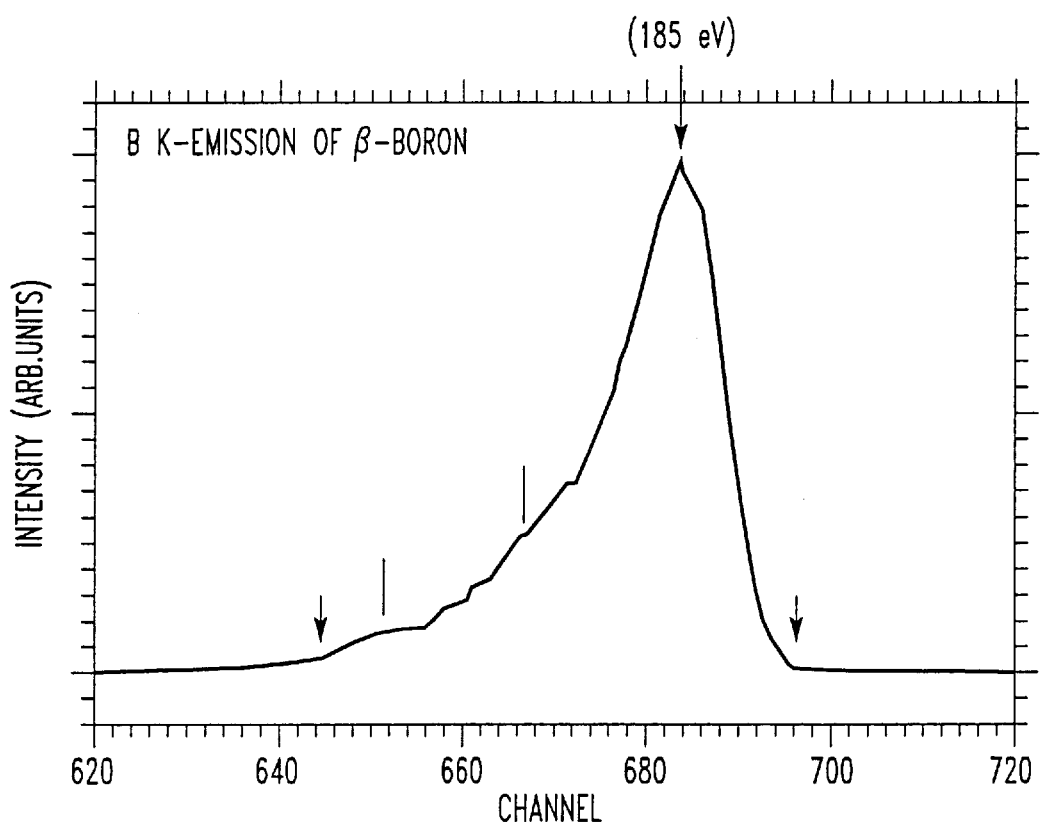
FIG. 2 is a diagram showing a K-emission spectrum of β-boron.

FIG. 2 shows a K-emission spectrum of β-boron obtained from a specimen surface consisting of a single crystal having a diameter of 600 nm at a probe current of about 70 nA. The detection time is about 1 hour. The horizontal axis indicates the number of channels of the CCD detector. The spectrum exhibits one peak indicated by an arrow and two shoulders indicated by vertical lines. By referring to already reported spectra owing to diffraction gratings, we find that the peak energy is 185 eV and the peak width is about 10 eV. It can be seen from FIG. 2 that the instrument of the present invention has high energy resolution and excellent S/N.

Figure 3:
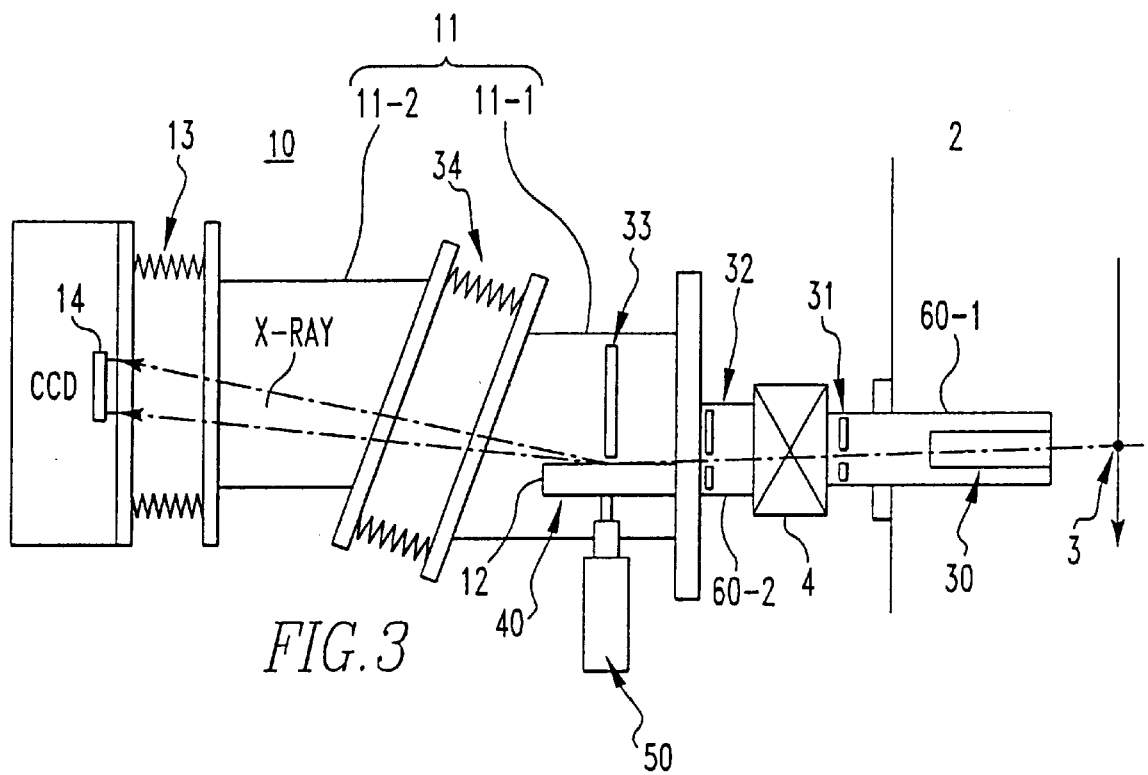
FIG. 3 is a conceptual view showing another example of a transmission electron microscope according to the present invention.

Another transmission electron microscope fitted with an X-ray spectrometer according to the invention is next described by referring to FIGS. 3–6. FIG. 3 is a conceptual diagram of this microscope (TEM). The TEM has a microscope column 2 that contains a specimen chamber in which a specimen 3 is placed. The sidewall of this specimen chamber is provided with a hole to take characteristic X-rays emitted from the specimen out of the microscope column 2. A metallic connector tube 60-1 is inserted in this hole. One end of the connector tube 60-1 extends into the specimen chamber toward the specimen 3, while the other end is connected with a gate valve 4. An X-ray spectrometer 10 is connected to the other end of the gate valve 4 via a metallic connector tube 60-2.

An X-ray condenser mirror 30 is mounted inside of the front end of the connector tube 60-1 to collect X-rays emitted from the specimen 3. The X-ray intensity incident on the diffraction grating is increased by collecting X-rays by the X-ray condenser mirror 30. Consequently, the measurement time is shortened, and the S/N of spectra can be enhanced. The collected X-rays enter the diffraction grating 12 having unequally spaced grooves via slits 31 and 32 positioned in the connector tubes 60-1 and 60-2, respectively, that are ahead of and behind the gate valve 4, respectively, the grating 12 being placed in the spectrometer chamber 11. A slit 33 is placed immediately above the incident face of the grating 12 at such a quite short distance from the incident face that incidence and departure of X-rays are not hindered. These slits 31, 32, and 33 prevent such a situation that radiation emitted from the illuminated point on the specimen and traveling off the X-ray path going to the diffraction grating reaches the CCD detector 14; otherwise, the radiation would be detected as background. Consequently, the S/N of the spectrum is improved.

The diffraction grating 12 having the unequally spaced grooves is mounted to a grating-exchanging mechanism 40

(described later). This mechanism 40 mounts and holds plural diffraction gratings each of which has unequally spaced grooves and which are different in measured energy range. One of the diffraction gratings is set in the X-ray incident position and diffracts X-rays. The tilt of the diffraction grating set in the X-ray incident position is adjusted by the grating tilt-adjusting mechanism 50.

The CCD detector 14 for detecting diffracted X-rays is mounted to the end of the spectrometer chamber 11 via the bellows 13. The spectrometer chamber 11 of the present invention comprises two split tubular sections 11-1, 11-2 and a bellows 34 connecting together these tubular sections 11-1 and 11-2. As shown in FIG. 3, the two tubular sections 11-1 and 11-2 are so arranged that their center axes are shifted relative to each other. The bellows 34 connects the two tubular sections 11-1 and 11-2 such that the bellows 34 and 13 are different in direction of expansion and contraction. The CCD detector 14 can be moved up and down and left and right (i.e., in two dimensions) by combining the expansion and contraction of the two bellows 13 and 34. Thus, the position can be finely adjusted. As described previously, where radiation is made to impinge on a diffraction grating of unequally spaced grooves at a large incidence angle, an imaging plane vertical to the diffracted radiation is formed. Therefore, it is necessary to align the light-sensitive face of the CCD detector 14 with the imaging plane. In the present embodiment, the tubular section 11-2 and the CCD detector 14 are moved using two bellows that are different in direction of expansion and contraction. In this way, the position and direction of the light-sensitive face relative to diffracted X-rays can be adjusted.

Therefore, deviation in the position of the CCD detector due to assembly error, for example, can be corrected. The position can be set optimally. At this time, the incidence of diffracted X-rays on the CCD detector can be optimized by combining this technique with adjustment made by the grating tilt-adjusting mechanism 50.

Figure 4:
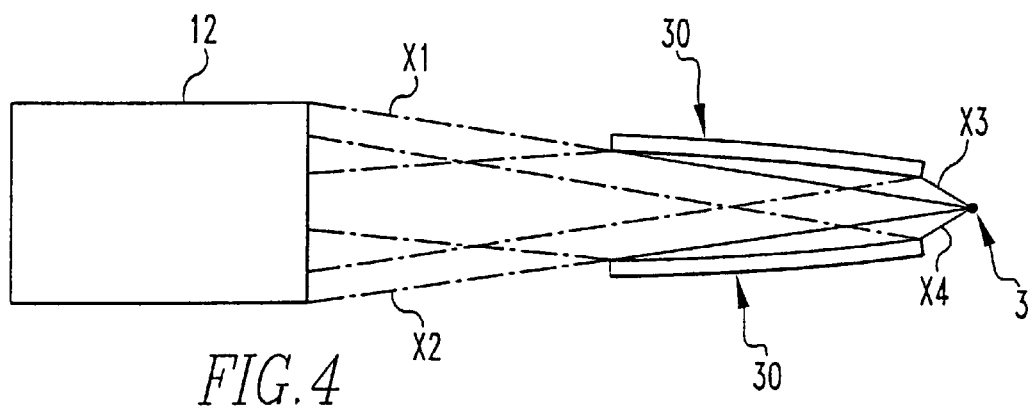
FIG. 4 is a diagram showing an X-ray condenser mirror.

FIG. 4 illustrates the X-ray condenser mirror 30 consisting of two mirror elements bonded together in a face-to-face relation. The facing surfaces of the mirror elements are flat within a plane perpendicular to the plane of the paper. The incidence angle of X-rays to the mirror elements in a plane parallel to the plane of the paper decreases gradually while drawing a curved surface. The space between the mirror elements is narrower on the specimen side and wider on the diffraction grating side.

X-rays emitted from the illuminated point on the specimen tilted toward the X-ray condenser mirror radiate in every solid-angle direction. Ranges indicated by X1 and X2 (straight lines connecting the illuminated point on the specimen with the ends of the diffraction grating) represent X-rays incident on the grating where no mirror is used. By appropriately setting up the condenser mirror, X-rays within ranges between X1 and X3 and between X2 and X4 are collected and impinge on the diffraction grating. X3 and X4 are straight lines connecting the specimen with the ends of the mirror elements on the side of the specimen. As a result, the intensity of X-rays incident on the diffraction grating is increased. That is, the solid angle at which X-rays are detected is increased. Hence, a decrease in the measurement time and improvement of the S/N of the spectrum can be achieved.

Figure 5A:
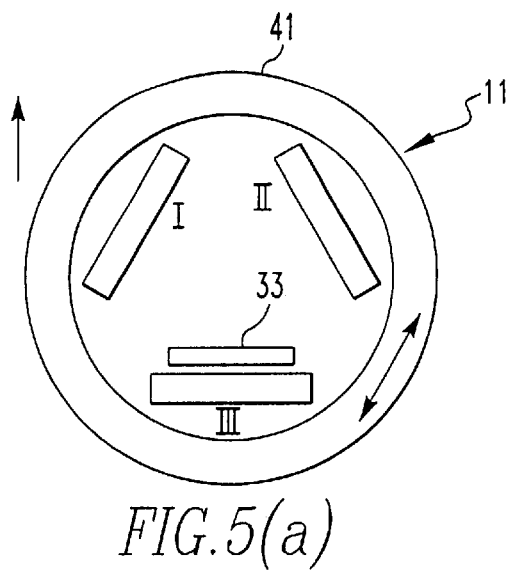
FIG. 5 is a view showing a grating-exchanging mechanism.
Figure 5B:
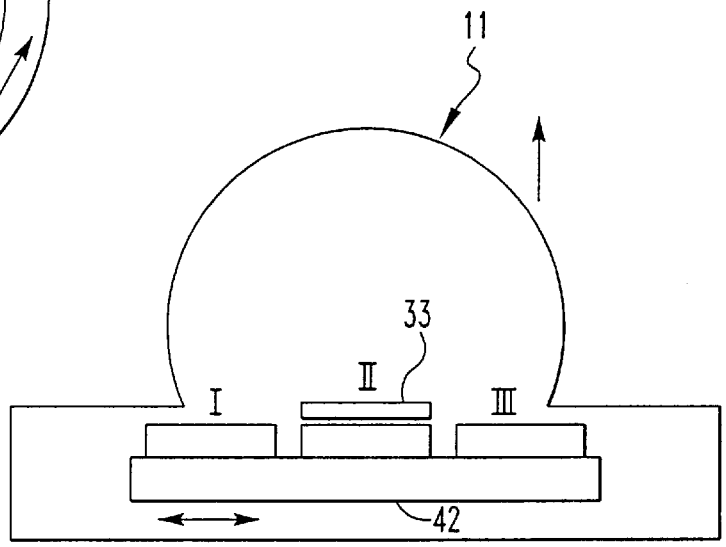

FIG. 5 illustrates an example of the grating-exchanging mechanism. In (a) of FIG. 5, diffraction gratings I, II, and III each of which has unequally spaced grooves and which are different in measured energy range are mounted to a rotary stage 41 capable of rotating within a vertical plane. The rotational angle of the rotary stage can be adjusted from outside the vacuum. Therefore, any desired one of the three diffraction gratings can be set in the X-ray incident position determined by the slit 33 without breaking the vacuum. Of course, a rotary stage rotating within a horizontal plane can also be used.

In the example of (b) in FIG. 5, diffraction gratings I, II, and III each of which has unequally spaced grooves and which are different in measured energy range are mounted to a horizontal moving stage 42. The position of the horizontally moving stage 42 can be adjusted from outside the vacuum. In consequence, any desired one of the three diffraction gratings can be set in the X-ray incident position determined by the slit 33 without breaking the vacuum.

A wider energy range from 60 to 1200 eV can be measured by interchangeably using the three diffraction gratings I, II, and III having different measured energy ranges as described above. In addition, a still wider energy range can be measured by mounting more diffraction gratings having different measured energy ranges and using the diffraction gratings interchangeably without breaking the vacuum.

Figure 6:
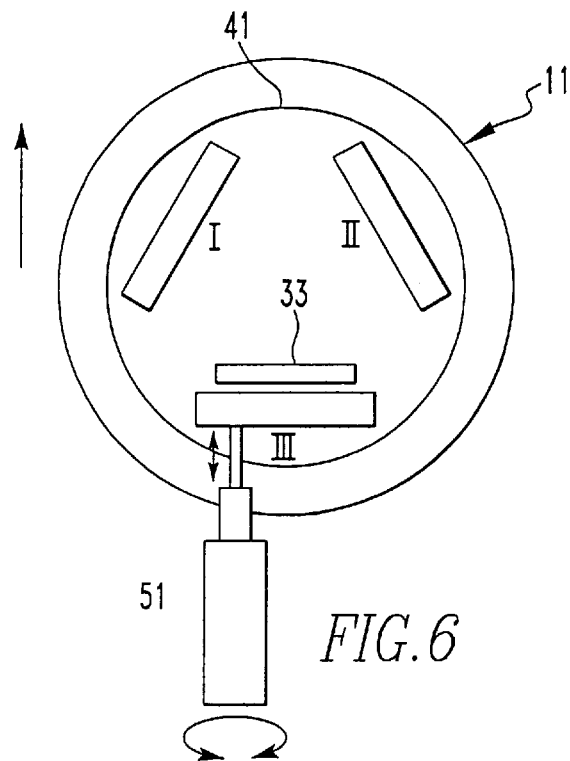
FIG. 6 is a view showing a grating tilt-adjusting mechanism.

FIG. 6 illustrates the grating tilt-adjusting mechanism. In this example, the tilt of the diffraction grating set in the X-ray incident position determined by the slit 33 can be corrected by the grating-exchanging mechanism using the rotary stage 41 shown in FIG. 5(a). That is, a linear introduction device 51 transforms a rotary motion into a linear motion. Thus, a rod contacted with one end of a diffraction grating is moved up and down. The height at one side of the diffraction grating can be adjusted with the tip of the rod. Consequently, the tilt of the diffraction grating due to assembly error can be corrected. In this manner, an optimum X-ray optical system can be accomplished.

Figure 7:
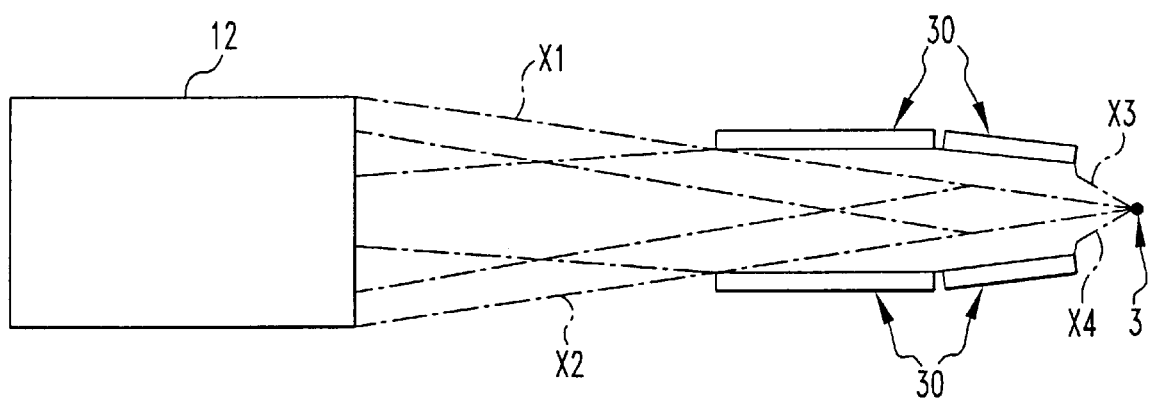
FIG. 7 is a view showing another X-ray condenser mirror.

FIG. 7 shows another example of the above-described condenser mirror 30. In the example of FIG. 4, two X-ray condenser mirror elements each having a curved surface are placed in a face-to-face relation during use. In the present example, four flat condenser mirror elements are used. Two mirror elements are combined on each side. Each mirror element is made of a silicon substrate. A thin film of gold is deposited by sputtering on the X-ray incident surface (facing surface) of each mirror element. This enhances the reflection efficiency of the mirror surface for X-rays.

It is to be noted that the present invention is not limited to the foregoing embodiments but rather various modifications are possible. For example, the slit 31 or 32 may be isolated from the surroundings and a voltage may be applied to the slit to repel secondary electrons in order to prevent the secondary electrons emitted from the illuminated point on the specimen from reaching the CCD detector 14; otherwise, some noise would be produced. Alternatively, trap electrodes to which a voltage is applied to attract secondary electrons may be disposed within the connector tubes 60-1 and 60-2.

In the embodiment described above, an X-ray spectrometer is mounted within the microscope of a TEM. An X-ray spectrometer may be combined with other kind of electron microscope such as SEM, EPMA, or Auger microprobe. In this case, the X-ray spectrometer may be mounted to the sidewall of the specimen chamber of the microscope such as SEM, EPMA, or Auger microprobe. In summary, the "electron microscope" referred to herein is not limited to TEM and SEM. Rather, it embraces every instrument having capabilities of imaging a specimen based on electron beam irradiation of the specimen.

As described thus far, the present invention can provide an electron microscope which has an optical system that is more compact than the prior art WDS and achieves higher resolution and which is equipped with an X-ray spectrometer capable of obtaining the partial state density of the valence band from a certain small specimen area.

Furthermore, the intensity of X-ray incident on the diffraction grating can be increased by collecting X-rays from a specimen by a condenser mirror and causing the X-rays to impinge on the grating. As a result, the measuring time can be shortened, and the S/N of the spectrum can be enhanced.

In addition, background due to stray radiation can be reduced by causing X-rays to enter the diffraction grating via plural slits. Consequently, the S/N of the spectrum can be enhanced.

Moreover, the position of the CCD detector can be finely adjusted up and down and left and right by mounting the CCD detector such that plural bellows having different directions of expansion and contraction are used in combination. Therefore, deviation of the position of the CCD detector due to assembly error can be corrected. The position can be set optimally.

Further, a wider energy range can be measured by exchanging the used diffraction grating without breaking the vacuum by providing a grating-exchanging mechanism on which plural diffraction gratings having different measured energy ranges are mounted.

Additionally, tilt of the diffraction grating due to assembly error can be corrected by providing a grating tilt-adjusting mechanism. In consequence, an optimum X-ray optical system can be accomplished.

As described thus far, an electron microscope equipped with an X-ray spectrometer according to the present invention is an instrument that is useful in obtaining the state density distributions of valence bands.

What is claimed is:

1. An electron microscope equipped with an X-ray spectrometer, comprising:

a spectrometer chamber which is formed in the X-ray spectrometer and whose inside is evacuated by a vacuum pumping system;

an X-ray detector mounted to an end of said spectrometer chamber; and at least one diffraction grating having unequally spaced grooves, said grating being disposed in the spectrometer chamber;

said X-ray spectrometer being mounted to a sidewall of said electron microscope via a gate valve;

wherein characteristic X-rays emitted from a specimen irradiated with an electron beam are made to impinge on a face of said diffraction grating at a large angle to said face and are detected by the X-ray detector.

2. An electron microscope equipped with an X-ray spectrometer as set forth in claim 1, wherein said X-ray detector is a back-illuminated CCD detector.

3. An electron microscope equipped with an X-ray spectrometer as set forth in claim 1, wherein X-rays diffracted by said diffraction grating emerge at an exit angle of 75 to 87° with respect to a normal line to the face of said diffraction grating.

4. An electron microscope equipped with an X-ray spectrometer as set forth in claim 1, wherein X-rays emitted from the specimen are collected by an X-ray condenser mirror and then made to impinge on said diffraction grating having the unequally spaced grooves.

5. An electron microscope equipped with an X-ray spectrometer as set forth in claim 1, wherein said at least one diffraction grating is plural diffraction gratings that are different in measured energy range, and wherein there is further provided a diffraction grating-exchanging mechanism capable of selectively placing said diffraction gratings in a characteristic X-ray incident position, one at a time.

6. An electron microscope equipped with an X-ray spectrometer as set forth in claim 5, wherein there is further provided a grating tilt-adjusting mechanism for adjusting tilt of the diffraction grating set in the characteristic X-ray incident position.

7. An electron microscope equipped with an X-ray spectrometer as set forth in claim 1, wherein said CCD detector is connected with said spectrometer chamber via a bellows so as to be movable relative to said diffraction grating.

8. An electron microscope equipped with an X-ray spectrometer as set forth in claim 7, wherein said bellows consists of plural bellows elements cascaded together, said bellows elements being different in direction of expansion and contraction, and wherein expansion and contraction of said bellows elements are so combined that the CCD detector can be moved in two dimensions relative to said diffraction grating.

* * * * *